United States Patent
Nam et al.

(10) Patent No.: US 11,914,451 B2
(45) Date of Patent: Feb. 27, 2024

(54) APPARATUSES AND METHODS FOR PROVIDING INTERNAL POWER VOLTAGES

(71) Applicant: MICRON TECHNOLOGY, INC., Boise, ID (US)

(72) Inventors: Ki-Jun Nam, Plano, TX (US); Younghoon Oh, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 17/893,946

(22) Filed: Aug. 23, 2022

(65) Prior Publication Data

US 2023/0393645 A1 Dec. 7, 2023

Related U.S. Application Data

(60) Provisional application No. 63/348,382, filed on Jun. 2, 2022.

(51) Int. Cl.
*G06F 1/32* (2019.01)
*G06F 1/3296* (2019.01)
*G11C 11/4074* (2006.01)

(52) U.S. Cl.
CPC ........ *G06F 1/3296* (2013.01); *G11C 11/4074* (2013.01)

(58) Field of Classification Search
CPC ............... G06F 1/3296; G11C 11/4074
See application file for complete search history.

(56) References Cited

U.S. PATENT DOCUMENTS

| | | | | |
|---|---|---|---|---|
| 6,498,469 B2 * | 12/2002 | Kobayashi | ............. | G05F 1/465 323/354 |
| 7,013,399 B2 * | 3/2006 | Sisler | ................. | H04Q 11/0421 713/340 |
| 7,639,547 B2 * | 12/2009 | Moon | .................... | G11C 5/145 365/201 |
| 2002/0031004 A1 * | 3/2002 | Miyamoto | ............. | G11C 11/22 365/145 |
| 2012/0020167 A1 * | 1/2012 | Lee | .................... | G11C 16/3418 365/185.25 |
| 2012/0153861 A1 * | 6/2012 | Katsis | .................... | G09G 3/025 315/291 |
| 2019/0180795 A1 * | 6/2019 | Doo | ....................... | G11C 5/148 |

* cited by examiner

*Primary Examiner* — Zahid Choudhury
(74) *Attorney, Agent, or Firm* — Dorsey & Whitney LLP (57) ABSTRACT

Apparatuses and methods for providing internal power voltages are described. An example apparatus includes a first, second, and third clamp circuits, and a clamp control circuit. The first clamp circuit is configured to receive a first external power voltage and provide a first voltage drop to provide a first internal power voltage. The second clamp circuit is configured to receive the first external power voltage and provide a second voltage drop to provide a second internal power voltage, wherein the first voltage drop is greater than the second voltage drop. The third clamp circuit is configured to receive a second external power voltage and provide the second external power voltage as the second internal power voltage when the second external power voltage is activated. The clamp control circuit is configured to activate the third clamp circuit when the second external power voltage reaches a trigger voltage level.

28 Claims, 8 Drawing Sheets

FIG. 9

APPARATUSES AND METHODS FOR PROVIDING INTERNAL POWER VOLTAGES

CROSS-REFERENCE TO RELATED APPLICATION

This application claims the filing benefit of U.S. Provisional Application No. 63/348,382, filed Jun. 2, 2022. This application is incorporated by reference herein in its entirety and for all purposes.

BACKGROUND

Electronic systems that include semiconductor devices, such as a dynamic random access memories (DRAMs), require power to operate. A power management circuit typically provides power to the semiconductor devices of the electronic system. The power management circuit may provide one or more different power voltages to the semiconductor devices for operation.

When an electronic system is first powered on, the power management circuit controls the timing of when it provides the one or more power voltages to the semiconductor devices. The controlled timing of providing the power voltages enables the semiconductor devices to perform planned power on sequences as the external power voltages ramp up to operational voltage levels. In this manner, power circuits of the semiconductor devices can begin developing and providing internal power voltages in a controlled manner to avoid issues that may arise if internal power voltages are uncontrolled, for example, inadvertent overvoltage conditions and/or current flow through the circuits of the semiconductor devices. Uncontrolled development and delivery of power internally may damage circuits and/or render circuits inoperable.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
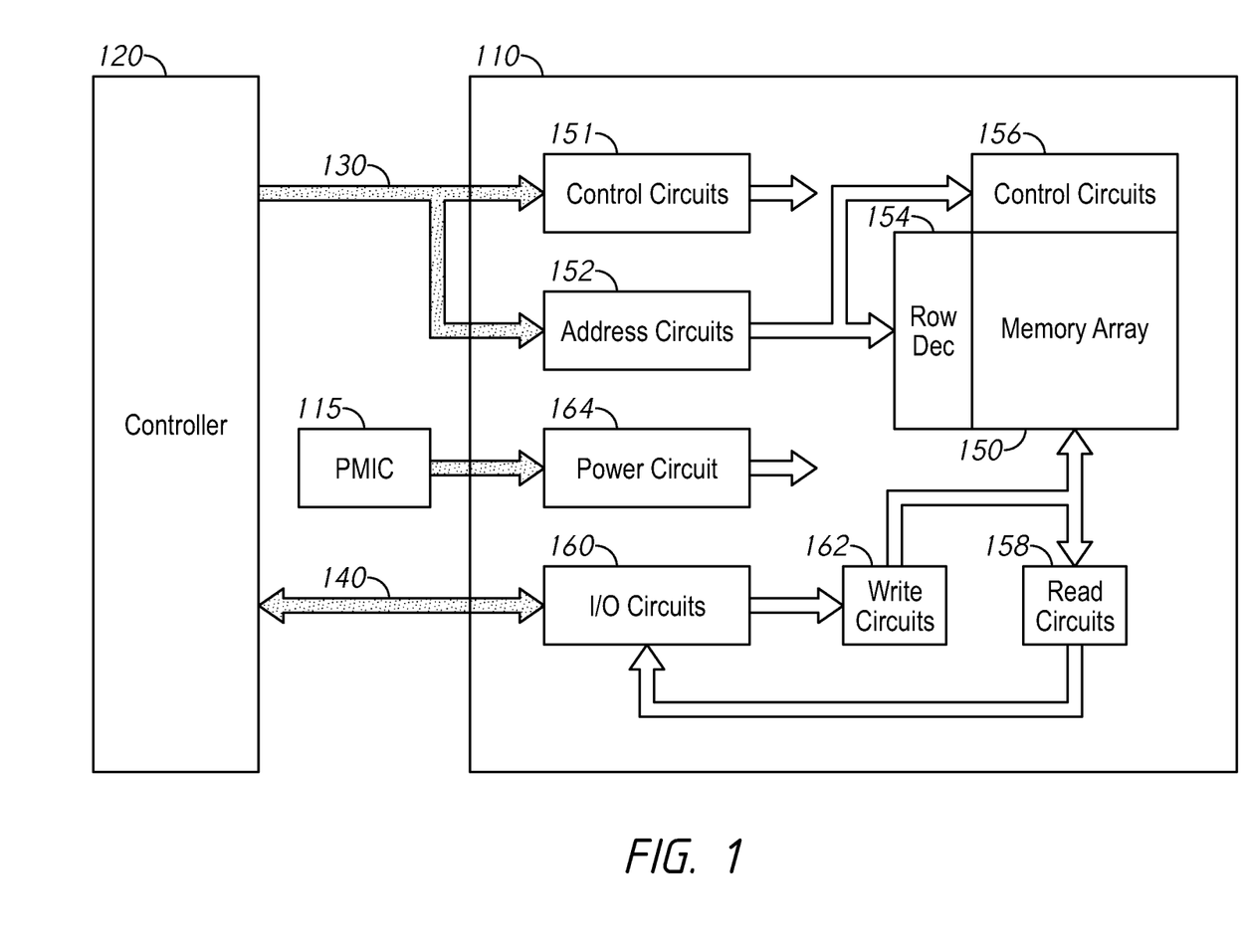
FIG. 1 is a block diagram of a system that includes a semiconductor device according to an embodiment of the disclosure.

FIG. 1 is a block diagram of a system 100 that includes a semiconductor device 110 according to an embodiment of the disclosure. In some embodiments of the disclosure, the system 100 is a memory system and the semiconductor device 110 is a memory.

The system 100 includes a controller 120 coupled to the semiconductor device 110 through a control signal bus 130 and a bidirectional data bus 140. The controller 120 may be a memory controller in some embodiments of the disclosure. The controller 120 may be coupled to a host, for example, and may receive command signals (or commands), address signals (or addresses), and data signals (or data) from the host and may output data to the host. A power management circuit 115 provides external power voltages that are used to power the semiconductor device 110. In some embodiments, the power management circuit 115 provides multiple different external power voltages and reference voltages to the semiconductor device 110. For example, the power management circuit 115 may provide multiple external positive power voltages having different voltage levels to the semiconductor device 110. The power management circuit 115 may be a separate device in some embodiments of the disclosure. In other embodiments, the power management circuit 115 may be included in another device (e.g., the controller 120).

In embodiments where the semiconductor device 110 is a memory, the control signal bus 130 may provide various command, address, control, and clock signals from the controller 120 to control operation of the memory 110. Example operations include memory access operations, such as a read operation that is performed when a read command is provided to the memory 110 and a write operation that is performed when a write command is provided to the memory 110. Data may be transferred between the memory 110 and the controller 120 over the data bus 140, for example, transferring read data from the memory 110 to the controller 120 for a read operation or transferring write data from the controller 120 to the memory 110 for a write operation.

The memory 110 includes a memory array 150 having memory cells that store data. The memory array 150 may be accessed to read from or write data to the memory cells. The memory array 150 may include nonvolatile memory cells in some embodiments. In other embodiments of the disclosure, the memory array 150 includes volatile memory cells.

The memory 110 includes control circuits 151 that decode commands provided by the control signal bus 130 and provide internal control signals to perform corresponding memory operations. For example, a read command provided by the controller 120 is decoded by the control circuits 151 and provides internal control signals to perform a read operation. Similarly, a write command provided by the controller 120 is decoded by the control circuits 151 and provides internal control signals to perform a write operation.

The memory also includes address circuits 152 to latch address signals provided over the control signal bus 130. The address signals are received and decoded by a row decoder 154 and a column decoder 156 to access the memory array 150. For example, row decoder 154 and/or a column decoder 156 may include drivers to activate access lines and access circuits to read data from or write data to memory cells of the memory array 150 that correspond to the address signals.

Data read from the memory array 150 is provided to read circuits 158 that then provides the read data to input/output (I/O) circuits 160. The I/O circuits 160 includes output drivers to provide read data over the data bus 140 to the controller 120. Data written to the memory array 150 is provided over the data bus 140 to the memory 110 and received by input receivers included in the I/O circuits 160. The write data is provided by the I/O circuits 160 to write circuits 162 that includes write driver circuits that write data to be stored in the memory array 150.

A power circuit 164 is provided external power voltages by the power management circuit 115 and provides internal power voltages based on the external power voltages. The internal power voltages may be used by circuits of the memory 110 during operation. The power circuit 164 may also provide the external power voltages to circuits of the memory 110. As will be described in more detail below, the external power voltages received by the power circuit 164 may be initially provided during a power on sequence where the external power voltages ramp up to operational voltage levels. During the power on sequence, the power circuit 164 may control the increasing relative voltage levels of the internal power voltages until reaching their operational voltage levels. Controlling the relative voltage levels of the internal power voltages may prevent inadvertent current flow through the circuits of the memory 110, which may damage the circuits if the internal power voltages are uncontrolled during the power on sequence.

Figure 2:
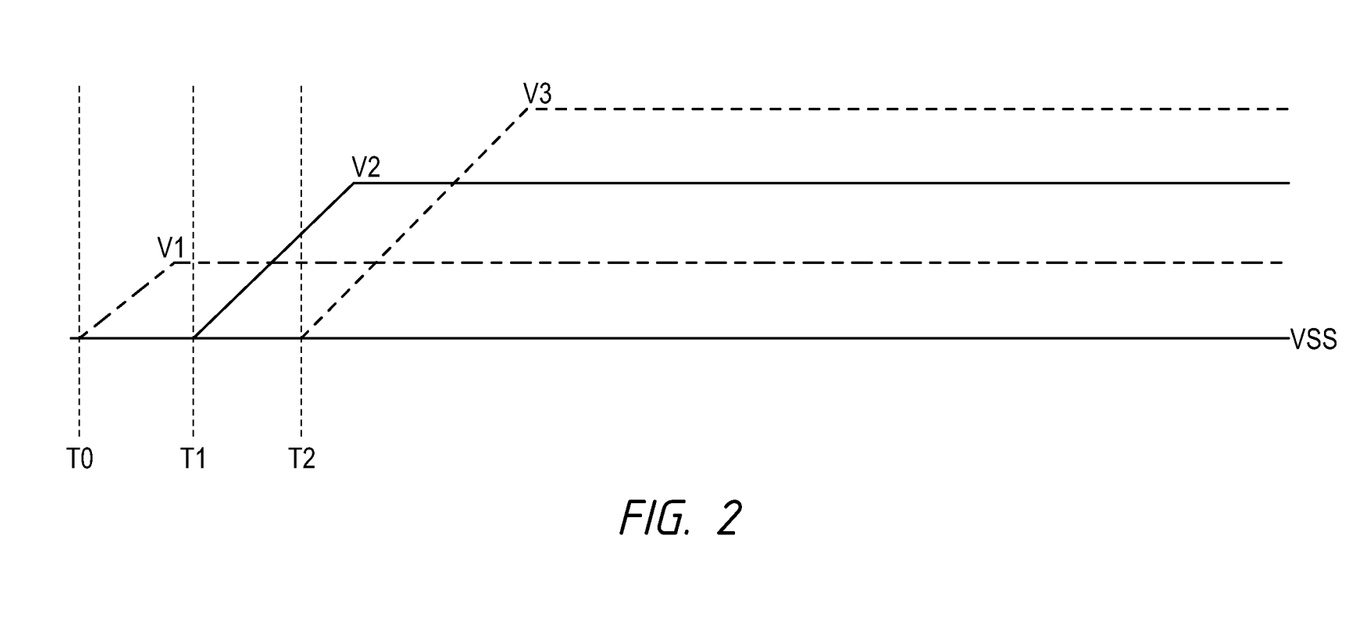
FIG. 2 is a diagram of a power on sequence for external power voltages according to an embodiment of the disclosure.

FIG. 2 is a diagram of a power on sequence for external power voltages according to an embodiment of the disclosure. The power on sequence may occur during a reset operation which the external power voltages are ramped up and reach stable operational voltage levels.

FIG. 2 shows relative voltage levels for external power voltages V1-V3 and reference voltage VSS, and relative timing for ramp up of the power voltages V1-V3 to their operational voltage levels. In some embodiments, the power on sequence of FIG. 2 may be used for the semiconductor device 110 of FIG. 1. The external power voltages V1-V3 may be provided by a power management circuit, for example, power management circuit 115 of FIG. 1. In such embodiments, the power a voltage V1 may be the power supply voltage VDD, the power voltage V2 may be the power supply voltage VHH, and the power voltage V3 may be the power supply voltage VPP. The reference voltage VSS may be the reference voltage VSS as shown in FIG. 1. Other external power voltages may also be provided during the power on sequence but are not shown in FIG. 2.

Generally, the reference voltage VSS is less than the V1 operational voltage level, the V1 operational voltage level is less than the V2 operational voltage level, and the V2 operational voltage level is less than the V3 power voltage level (e.g., V1<V2<V3). For example, in some embodiments of the disclosure, the reference voltage VSS is ground, the V1 operational voltage level is 1.2V, the V2 operational voltage level is 3.3V, and the V3 operational voltage level is 4.5V.

Additionally, the power voltage V1 begins to ramp up (e.g., increase) before the power voltage V2, and the power voltage V2 begins to ramp up before the power voltage V3. For example, with reference to FIG. 2, at time T0 the power voltage V1 begins to ramp up to the V1 operational voltage level. At time T1 following time T0, the power voltage V2 begins to ramp up to the V2 operational voltage level, which is greater than the V1 operational voltage level. At time T2 following time T1, the power voltage V3 begins to ramp up to the V3 operational voltage level, which is greater than the V2 operational voltage level.

As previously described, the external power voltages V1-V3 and the reference voltage VSS may be used by a power circuit, for example, the power circuit 164 of the semiconductor device 110 of FIG. 1, to provide internal power voltages to various circuits. The power circuit may include voltage pump circuits, voltage circuits, voltage clamp circuits, control circuits, or combinations thereof to provide internal power voltages based on one or more of the external power voltages. The internal power voltages may be pumped voltages based on one or more of the external power voltages (e.g., internal power voltages that are greater than the voltage level of the external power voltage(s) the internal pumped voltage is based).

Figure 3:
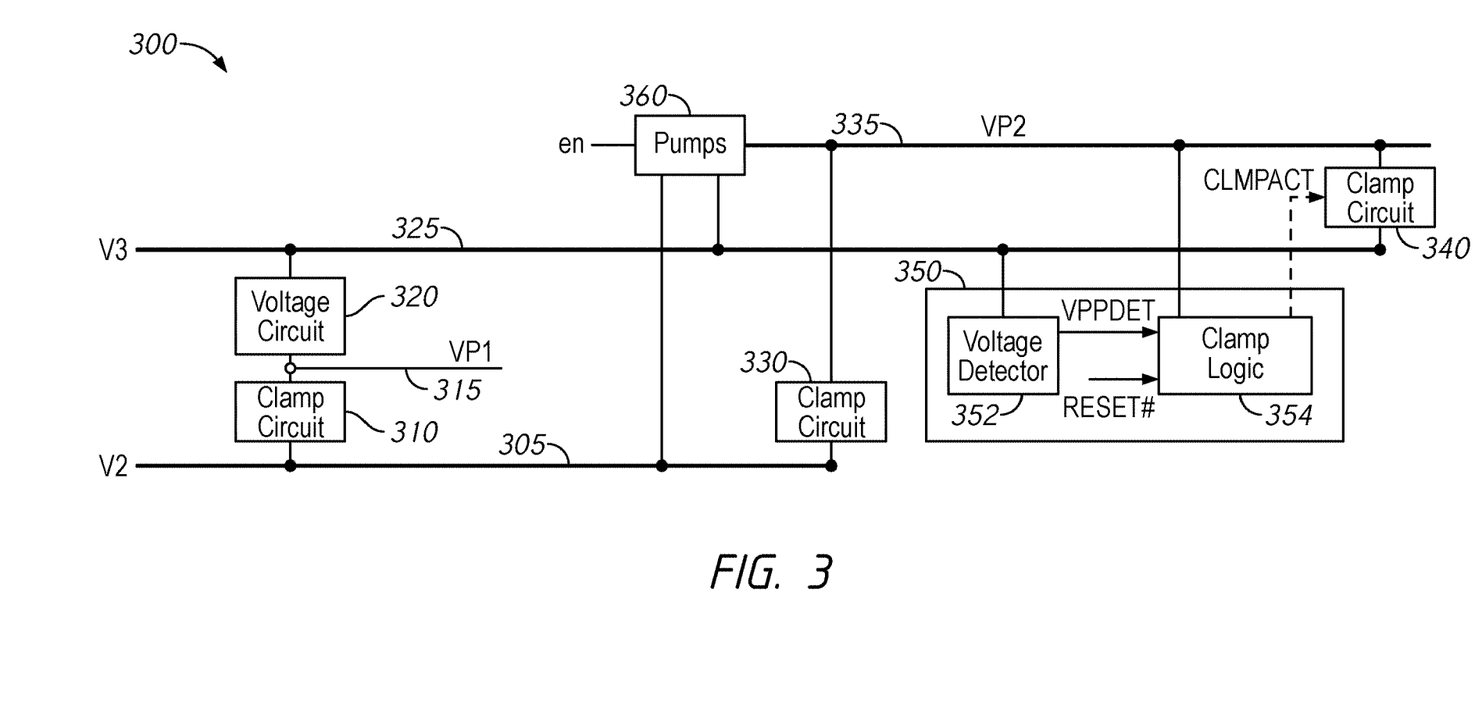
FIG. 3 is a diagram of a power circuit for providing internal power voltages based on external power voltages according to an embodiment of the disclosure.

FIG. 3 is a diagram of a power circuit 300 for providing internal power voltages based on external power voltages according to an embodiment of the disclosure. In some embodiments, the power circuit 300 may be included in the power circuit 164 of the semiconductor device 110 of FIG. 1.

The power circuit 300 includes a clamp circuit 310 coupled to a power node 305 to which the external power voltage V2 is provided, and further coupled to an internal power node 315 at which an internal power voltage VP1 is provided. The power circuit 300 further includes a voltage circuit 320 coupled to the internal power node 315 and to a power node 325 to which the external power voltage V3 is provided. The clamp circuit 310 holds the internal power voltage VP1 to a voltage level that is relative to the power voltage V2 until the voltage circuit 320 is activated to provide the internal power voltage VP1 having a voltage level based on the power voltage V3.

As previously described, in some embodiments of the disclosure, the clamp circuit 310 holds the internal power voltage VP1 to a lower voltage level based on the power voltage V2. For example, the clamp circuit 310 may provide a voltage drop that sets the internal power voltage VP1 to a lower voltage level than the power voltage V2. In some embodiments of the disclosure, the clamp circuit 310 may hold the internal power voltage VP1 to a threshold voltage Vth(1) less than the power voltage V2 of the power node 305 (e.g., a voltage drop of Vth(1)). As the power voltage V2 ramps up, for example, during a power on sequence (e.g., as previously described with reference to FIG. 2), the internal power voltage VP1 will also ramp up, but have a voltage level a threshold voltage Vth(1) less than the increasing power voltage V2.

As also previously described, the clamp circuit 310 continues to hold the internal power voltage VP1 to the voltage relative to the power voltage V2 until the voltage circuit 320 is activated and begins driving the internal power voltage VP1 to a different voltage level that is based on the power voltage V3. The voltage circuit 320 may be activated, for example, after completion of a reset operation including the power on sequence. In some embodiments of the disclosure, the voltage circuit 320 includes an enable circuit and a voltage regulator circuit. The voltage circuit 320 may be activated by an active enable signal enb to provide a voltage to the internal power node 315 as the internal power voltage VP1. The voltage circuit 320 provides a voltage that is based on the power voltage V3. The voltage provided by the voltage circuit 320 may be less than the power voltage V3 in some embodiments of the disclosure. The voltage may also be greater than the power voltage V2 in some embodiments. For example, the voltage circuit 320 provides 4.25V in some embodiments having a V2 power voltage of 3.3V and a V3 power voltage of 4.5V. As a result, the voltage level of the internal power voltage VP1 is 4.25 V.

The power circuit 300 further includes clamp circuit 330 and clamp circuit 340, and a clamp control circuit 350. The clamp circuit 330 is coupled to the power node 305 and an internal power node 335 at which an internal power voltage VP2 is provided. The operational voltage level of the internal power voltage VP2 may be greater than the operational voltage level of the internal power voltage VP1. The clamp circuit 340 is coupled to the power node 325 and the internal power node 335. The clamp circuit 340 is activated by a control signal CLMPACT that is provided by the clamp control circuit 350 when the power voltage V3 reaches a trigger voltage level, for example, as the power voltage V3 is ramping up during a power on sequence.

The clamp circuit 330 holds the internal power voltage VP2 to a voltage level that is relative to the power voltage V2 until the clamp circuit 340 is activated to then hold the internal power voltage VP2 to a voltage level that is relative to the power voltage V3. In some embodiments of the disclosure, the clamp circuit 330 holds the internal power voltage VP2 to a lower voltage level relative to the power voltage V2. For example, the clamp circuit 330 may provide a voltage drop that sets the internal power voltage VP2 to a lower voltage level than the power voltage V2 in such embodiments. In some embodiments of the disclosure, the clamp circuit 330 may hold the internal power voltage VP2 to a threshold voltage Vth(2) less than the power voltage V2 of the power node 305 (e.g., a voltage drop of Vth(2)). As the power voltage V2 ramps up, for example, during a power on sequence (e.g., as previously described with reference to FIG. 2), the internal power voltage VP2 will also ramp up, but have a voltage level a threshold voltage Vth(2) less than the increasing power voltage V2. The clamp circuit 330 continues to hold the internal power voltage VP2 to the voltage relative to the power voltage V2 until the clamp circuit 340 is activated and holds the internal power voltage VP2 to a different voltage level that is based on the power voltage V3.

When the power voltage V3 reaches the trigger voltage level (e.g., during ramp up for a power on sequence), the clamp control circuit 350 provides an active control signal CLMPACT that activates the clamp circuit 340. The activated clamp circuit 340 holds the voltage level of the internal power voltage VP2 provided at the internal power node 335 based on the power voltage V3. For example, in some embodiments of the disclosure, the clamp circuit 340 provides the power voltage V3 to the internal power node 335 and holds the internal power voltage VP2 to a voltage level equal to the power voltage V3. When the clamp circuit 340 is activated, the voltage level of the internal power voltage VP2 increases from the voltage level held by the clamp circuit 330 (e.g., in some embodiments, the voltage level held by the clamp circuit 330 is a threshold voltage Vth(2) less than the power voltage V2).

In some embodiments of the disclosure, the clamp control circuit 350 includes a voltage detector circuit 352 and clamp control logic 354. The voltage detector circuit 352 is coupled to the power node 325 to provide an active control signal VPPDET when the voltage level of the power node 325 reaches a trigger voltage level. Thus, when the external power voltage V3 ramps up and reaches the trigger voltage level, the voltage detector circuit 352 provides an active control signal VPPDET. The clamp control logic 354 receives the control signal VPPDET and a reset control signal RESET #, and is coupled to the internal power node 335. The clamp control logic 354 provides a clamp control signal CLMPACT to control activation of the clamp circuit 340. For example, when the voltage detector circuit 352 provides an active control signal VPPDET to the clamp control logic 354, the clamp control logic 354 provides an active clamp control signal CLMPACT to activate the clamp circuit 340. As a result, when the power voltage reaches the trigger voltage level, the clamp control logic 354 activates the clamp circuit 340, which then holds the voltage level of the internal power voltage VP2 based on the power voltage V3.

The power circuit 300 further include a voltage pump circuit 360. When activated, the voltage pump circuit 360 provides the internal power voltage VP2 at a voltage level that is greater than the power voltage V2 and greater than the power voltage V3. For example, in some embodiments of the disclosure, the voltage pump circuit 360 provides an internal power voltage VP2 having a voltage level of 5.5V, where the power voltage V3 is 4.5V and the power voltage V2 is 3.3V. The voltage pump circuit 360 may be enabled, for example, following completion of a reset operation that includes a power on sequence.

As previously described, the clamp circuit 310 may provide a voltage drop that sets the internal power voltage VP1 to be less than the power voltage V2 (e.g., a voltage drop of Vth(1)), and the clamp circuit 330 may provide a voltage drop that sets the internal power voltage VP2 to also be less than the power voltage V2 (e.g., a voltage drop of Vth(2)). In some embodiments of the disclosure the clamp circuit 310 provides a greater voltage drop than the clamp circuit 330. As a result, the clamp circuit 310 holds the internal power voltage VP1 at a voltage level that is less than the voltage level the clamp circuit 330 holds the internal power voltage VP2. When the clamp circuit 340 is activated by the power voltage V3 reaching the trigger voltage, the internal power voltage VP2 is driven to a higher voltage level from the voltage level held by the clamp circuit 330. Thus, during the power on sequence, the voltage levels of the internal power voltages VP1 and VP2 relative to one another can be controlled by the clamp circuits 310, 330, and 340. In a particular example, the clamp circuits 310, 330, and 340 control the voltage level of the internal power voltage VP2 to be greater than the voltage level of the internal power voltage VP1 during the power on sequence.

Maintaining the internal power voltage VP2 to be greater than the internal power voltage VP1 during the power on sequence may prevent inadvertently forward biasing semiconductor junctions and cause leakage currents that may unnecessarily consume power and/or damage circuits.

Operation of the power circuit 300 will be described with reference to FIG. 4. However, operation of the power circuit 300 is not limited to that shown in FIG. 4. In some embodiments, the power circuit 300 may be operated with a different power on sequence and/or reset operation than shown in FIG. 4.

Figure 4:
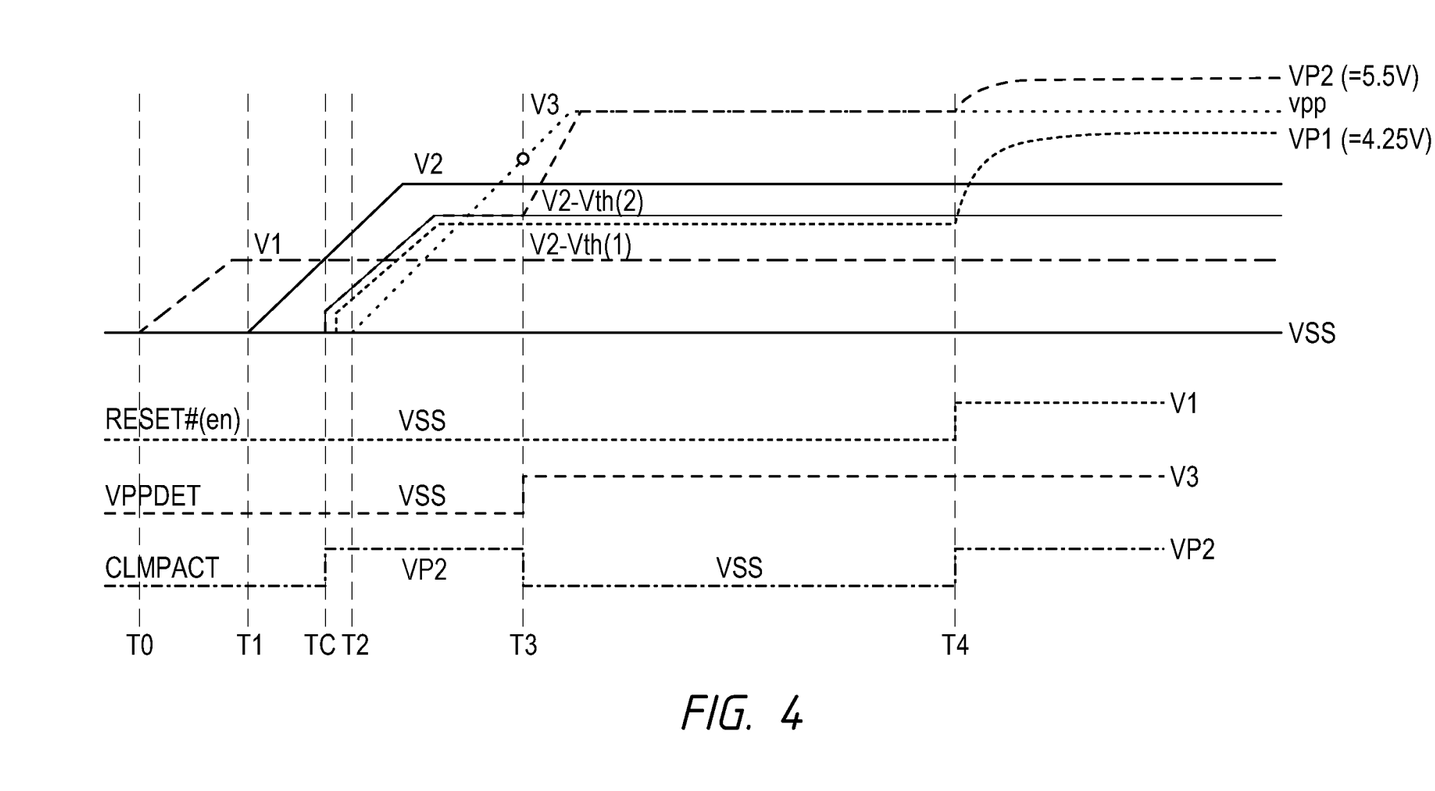
FIG. 4 is a diagram of a power on sequence for external power voltages and internal power voltages according to an embodiment of the disclosure.

FIG. 4 is a diagram of a power on sequence for external power voltages and internal power voltages according to an embodiment of the disclosure. The sequence of ramping up the power voltages V1-V3 as shown in FIG. 4 are the same as shown in FIG. 2. However, internal power voltages VP1 and VP2 are also shown in FIG. 4. Control signals RESET #, VPPDET, and CLMPACT are also shown in FIG. 4. In some embodiments, the power on sequence of FIG. 4 may be used for the semiconductor device 110 of FIG. 1. In such embodiments, a voltage V1 may be the power supply voltage VDD, a voltage V2 may be the power supply voltage VHH, and a voltage V3 may be the power supply voltage VPP; and the internal power voltage VP1 may be the internal power voltage hpvpp and the internal power voltage VP2 may be the internal power voltage hpselvpump. In some embodiments of the disclosure, the control signal RESET # is provided at a high logic level with a voltage of V1 (e.g., power voltage VDD) or a low logic level of VSS, the control signal VPPDET is provided at a high logic level with a voltage of V3 (e.g., power voltage VPP) or a low logic level of VSS, and the control signal CLMPACT is provided at a high logic level with a voltage of VP2 (e.g., internal power voltage hpselvpump) or a low logic level of VSS.

At time T0 the power voltage V1 begins to ramp up to the V1 operational voltage level. At time T1 following time T0, the power voltage V2 begins to ramp up to the V2 operational voltage level, which is greater than the V1 operational voltage level.

Following time T1 when the voltage level of the power voltage V2 exceeds a voltage drop provided by the clamp circuit 330 (e.g., Vth(2)), the internal power voltage VP2 begins to ramp up, for example, at time TC. Similarly, following time T1 when the voltage level of the power voltage V2 exceeds a voltage drop provided by the clamp circuit 310 (e.g., Vth(1)), the internal power voltage VP1 also begins to ramp up. In embodiments where the voltage drop of the clamp circuit 310 is greater than the voltage drop of the clamp circuit 330 (e.g., Vth(1)>Vth(2)), the voltage level of the internal power voltage VP2 will be greater than the voltage level of the internal power voltage VP1 as the power voltage V2 ramps up. When the power voltage V2 reaches its power on voltage level and is constant, the clamp circuits 330 and 310 will continue to hold the internal power voltage VP2 at a higher voltage level than the internal power voltage VP1.

With reference to the control signal CLMPACT provided by the clamp control circuit 350, when the internal power voltage VP2 begins to ramp up at time TC, the clamp control circuit 350 provides an inactive control signal CLMPACT (e.g., inactive high logic level). The clamp control logic 354 provides the inactive control signal CLMPACT based on detecting the increasing internal power voltage VP2 from the internal power node 335 and an inactive control signal VPPDET that indicates the power voltage V3 is less than the trigger voltage. The condition suggests that the internal power voltage VP2 may be greater than the power voltage V3, which has yet to begin ramping up (e.g., the power voltage V3 begins ramping up at time T2 following after time TC). As a result, the inactive control signal CLMPACT deactivates the clamp circuit 340 while the internal power voltage VP2 has a higher voltage level than the power voltage V3. Deactivating the clamp circuit 340 while the internal power voltage VP2 has a greater voltage level than the power voltage V3 may prevent inadvertent current flow, for example, from forward biasing semiconductor junctions with the higher internal power voltage VP2.

At time T2, the power voltage V3 begins to ramp up to the V3 operational voltage level, which is greater than the V2 operational voltage level. During ramp up, when the power voltage V3 reaches a trigger voltage, for example, at time T3, the clamp control circuit 350 provides an active CLMPACT signal to activate the clamp circuit 340. In some embodiments of the disclosure, the trigger voltage is greater than the V2 operational voltage level. In some embodiments of the disclosure, the trigger voltage is less than the V3 operational voltage level. The voltage detector circuit 352 detects the power voltage V3 reaching the trigger voltage and provides an active control signal VPPDET to the clamp logic circuit 354. The clamp logic circuit 354 in turn provides an active clamp control signal CLMPACT (e.g., active low logic level) to activate the clamp circuit 340. The activated clamp circuit 340 holds the internal power voltage VP2 at a voltage level based on the power voltage V3. For example, in some embodiments of the disclosure, the activated clamp circuit 340 provides the power voltage V3 to the internal power node 335. As a result, the activated clamp circuit 340 causes the internal power voltage VP2 to increase from the voltage level at which it was held by the clamp 330 to the voltage level of the power voltage V3, as shown in FIG. 4 following time T3. When the power voltage V3 reaches its power on voltage level and is constant, the activated clamp circuit 340 may continue to hold the internal power voltage VP2 at the same V3 operational voltage level.

In some embodiments of the disclosure, the V2 operational voltage level is greater than the V1 operational voltage level, and the V3 operational voltage level is greater than the V2 operational voltage level. Additionally, after the power voltages V1-V3 reach their respective operational voltage levels during the power on sequence, the VP2 power on voltage level is greater than the V1 operational voltage level and greater than the V2 operational voltage level; and the VP1 power on voltage level is less than the VP2 power on voltage level and the V2 operational voltage level, but greater than the V1 operational voltage level. For example, after reaching operational and power on voltage levels during the power on sequence, V1<VP1<V2<VP2 as shown between times T3 and T4 in FIG. 4.

Following the power voltages V1, V2, and V3 reaching their operational voltage levels and the internal power voltages VP1 and VP2 reaching their power on voltage levels, the reset operation is completed, and the internal power voltages VP1 and VP2 are then driven to their respective operational voltage levels from their power on voltage levels. In the example of FIG. 4, the control signal RESET # becomes inactive at time T4 (e.g., inactive high logic level) indicating completion of the reset operation. The inactive reset operation causes an enable signal en based on the control signal RESET # to become active (e.g., en active high logic level). The active enable signal en activates the voltage circuit 320 and/or the voltage pump 360.

The activated voltage circuit 320 drives the internal power voltage VP1 from the voltage level at which it was held by the clamp circuit 310 to a voltage level based on the power voltage V3. As a result, the voltage level of the internal power voltage VP1 increases until reaching its operational voltage level. The increasing voltage level of the internal power voltage VP1 is shown in FIG. 4 following time T4. In some embodiments of the disclosure, the VP1 operational voltage level is less than the V3 operational voltage level and greater than the V2 operational voltage level. For example, the VP1 operational voltage level is 4.25V, and the V3 operational voltage level is 4.5V and the V2 operational voltage level is 3.3V in some embodiments of the disclosure.

The activated voltage pump circuit 360 provides a voltage to the internal power node 335 that is greater than the operational voltage level of the power voltage V3. For example, the VP2 operational voltage level is 5.5V, and the operational voltage level of the power voltage V3 is 4.5V in some embodiments of the disclosure. The voltage level of the internal power voltage VP2 increases from the V3 operational voltage level at which it was held by the clamp circuit 340 to a VP2 operational voltage level that is greater than the power voltage V3. The increasing voltage level of the internal power voltage VP2 is shown in FIG. 4 following time T4.

As illustrated by the example of FIG. 4, the internal power voltage VP2 may be increased in phases before further pumping the internal power voltage VP2 to its operational voltage level. The internal power voltage VP2 increases initially to a voltage level based on the power voltage V2 (e.g., clamped to a voltage level by clamp circuit 330), and is then further increased to a voltage level based on the power voltage V3 (e.g., clamped to a voltage level by clamp 340) before being finally pumped to a higher operational voltage level. Increasing the voltage level of the internal power voltage VP2 in stages may be more efficient and save power compared to pumping the internal power voltage VP2 from a voltage level less than, for example, the external power voltage V3. Increasing the voltage level of the internal power voltage VP1 may be accomplished in a similar manner over multiple stages. For example, as shown in FIG. 4, increasing the internal power voltage VP1 to a voltage level based on the power voltage V2 before driving the internal power voltage VP1 to a higher voltage level based on the power voltage V3 (e.g., providing a regulated voltage from voltage circuit 320).

The respective operational voltage levels of the power voltages V1-V3 may remain constant at the same respective operational voltage levels following time T4. In some embodiments of the disclosure, after the internal power voltages VP1 and VP2 reach their respective operational voltage levels following time T4, the VP2 operational voltage level is greater than the V3 operational voltage level, and the VP1 operational voltage level is less than the V3 operational voltage level but greater than the V2 operational voltage level (e.g., after reaching operational voltage levels during the reset operation, V1<V2<VP1<V3<VP2).

Figure 5:
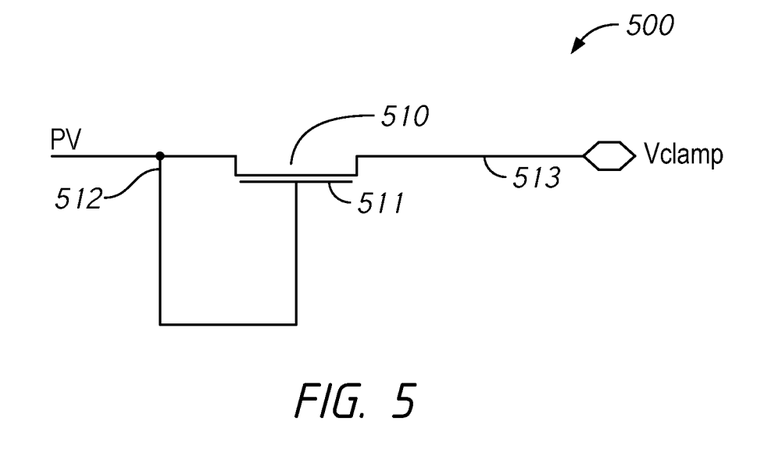
FIG. 5 is a schematic diagram of a clamp circuit according to an embodiment of the disclosure.

FIG. 5 is a schematic diagram of a clamp circuit 500 according to an embodiment of the disclosure. In some embodiments, the clamp circuit 500 is included in the clamp circuit 330 and/or the clamp circuit 310 of FIG. 3.

The clamp circuit 500 includes a transistor 510. The transistor 510 is diode-coupled having a gate 511 coupled to a drain 512. The transistor 510 holds (e.g., clamps) a voltage Vclamp at a source 513 that is based on a voltage PV provided at the drain 512 of transistor 510. For example, the diode-coupled transistor 510 of the clamp circuit 500 holds an internal power voltage at its source 513 (e.g., internal power voltage VP2 as Vclamp) to a voltage that is Vth less than a power voltage provided at its drain 512 (e.g., power voltage V2 as PV). The Vth is a threshold voltage of the transistor 510.

The clamp circuit 500 may be included in the clamp circuit 330 and the clamp circuit 310. The clamp circuit 330 is provided the power voltage V2 as PV and holds the internal power voltage VP2 as Vclamp, and the clamp circuit 330 is also provided the power voltage V2 as PV and holds the internal power voltage VP1 as Vclamp. In some embodiments having the clamp circuit 500 included in the clamp circuit 330 and in the clamp circuit 310, the Vth of the transistor 510 for the clamp circuit 330 (e.g., Vth(2)) is less than the Vth of the transistor 510 for the clamp circuit 310 (e.g., Vth(1)). In this manner, the voltage level of the internal power voltage VP2 provided by the clamp circuit 330 remains greater than the voltage level of the internal power voltage VP1 provided by the clamp circuit 310, for example, during a power on sequence. That is, the diode-coupled transistor 510 for the clamp circuit 310 provides a larger voltage drop to set the internal power voltage VP1 in comparison to a voltage drop of the diode-coupled transistor 510 for the clamp circuit 330 that sets the internal power voltage VP2.

Figure 6:
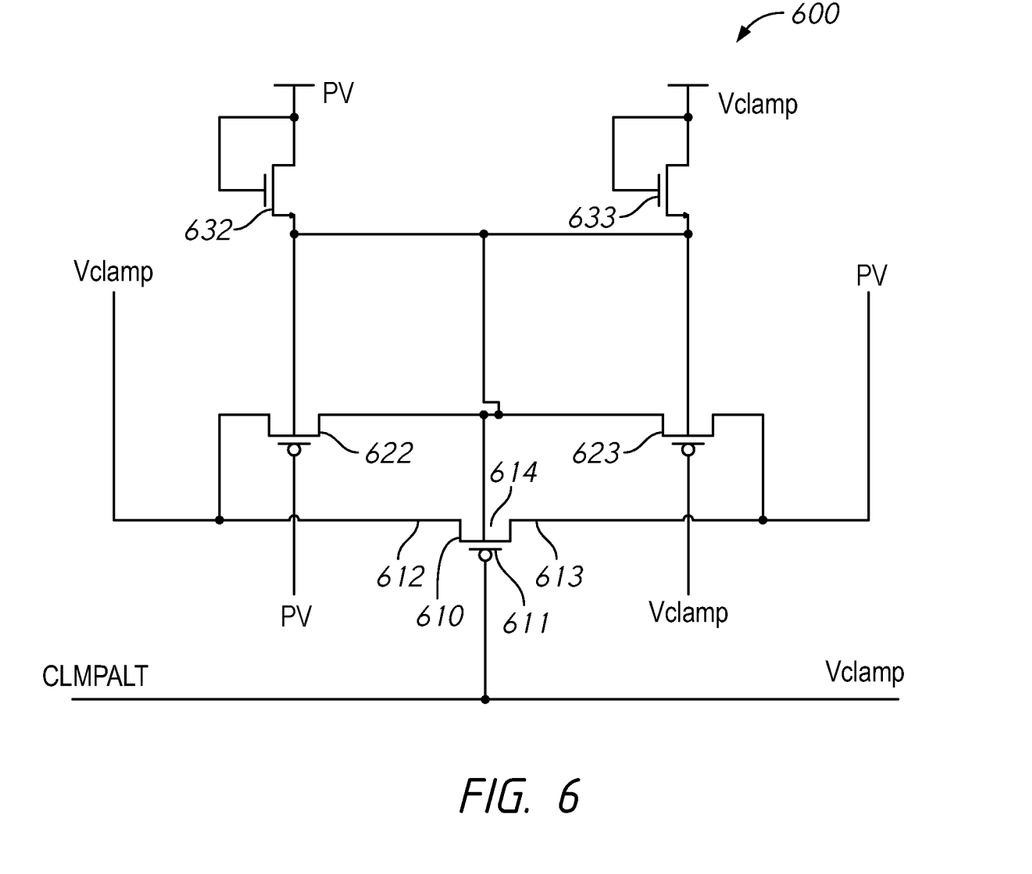
FIG. 6 is a schematic diagram of a clamp circuit according to an embodiment of the disclosure.

FIG. 6 is a schematic diagram of a clamp circuit 600 according to an embodiment of the disclosure. The clamp circuit 600 may be included in the clamp circuit 340 in some embodiments.

The clamp circuit 600 includes a transistor 610 that is activated when an active control signal CLMPACT (e.g., active low signal) is provided to a gate 611. When activated, the transistor 610 holds (e.g., clamps) a voltage Vclamp at a drain 612 that is based on a voltage PV provided at the source 613 of the transistor 610. For example, when the transistor is activated, the transistor 610 holds the voltage Vclamp to be the same as the voltage PV.

The clamp circuit 600 further includes transistors 622 and 623, and diode-coupled transistors 632 and 633 to dynamically bias a body 614 of the transistor 610 to prevent inadvertent current flow during normal operation. For example, the diode-coupled transistor 633 and the transistor 622 (when activated) provide a bias to the body 614 of the transistor 610 that is based on the voltage Vclamp when voltage Vclamp is greater than voltage PV. The diode-coupled transistor 632 and the transistor 623 (when activated) provide a bias to the body 614 of the transistor 610 that is based on the voltage PV when the voltage PV is greater than voltage Vclamp. Thus, regardless of the relative voltage levels of the voltage Vclamp and voltage PV, the body 614 of the transistor 610 is biased to prevent inadvertent current flow between the source 613 and drain 612.

In embodiments where the clamp circuit 600 is included in the clamp circuit 340, the voltage PV is the power voltage V3 and the voltage Vclamp is the internal power voltage VP2. The control signal CLMPACT is provided by the clamp control circuit 350.

Figure 7:
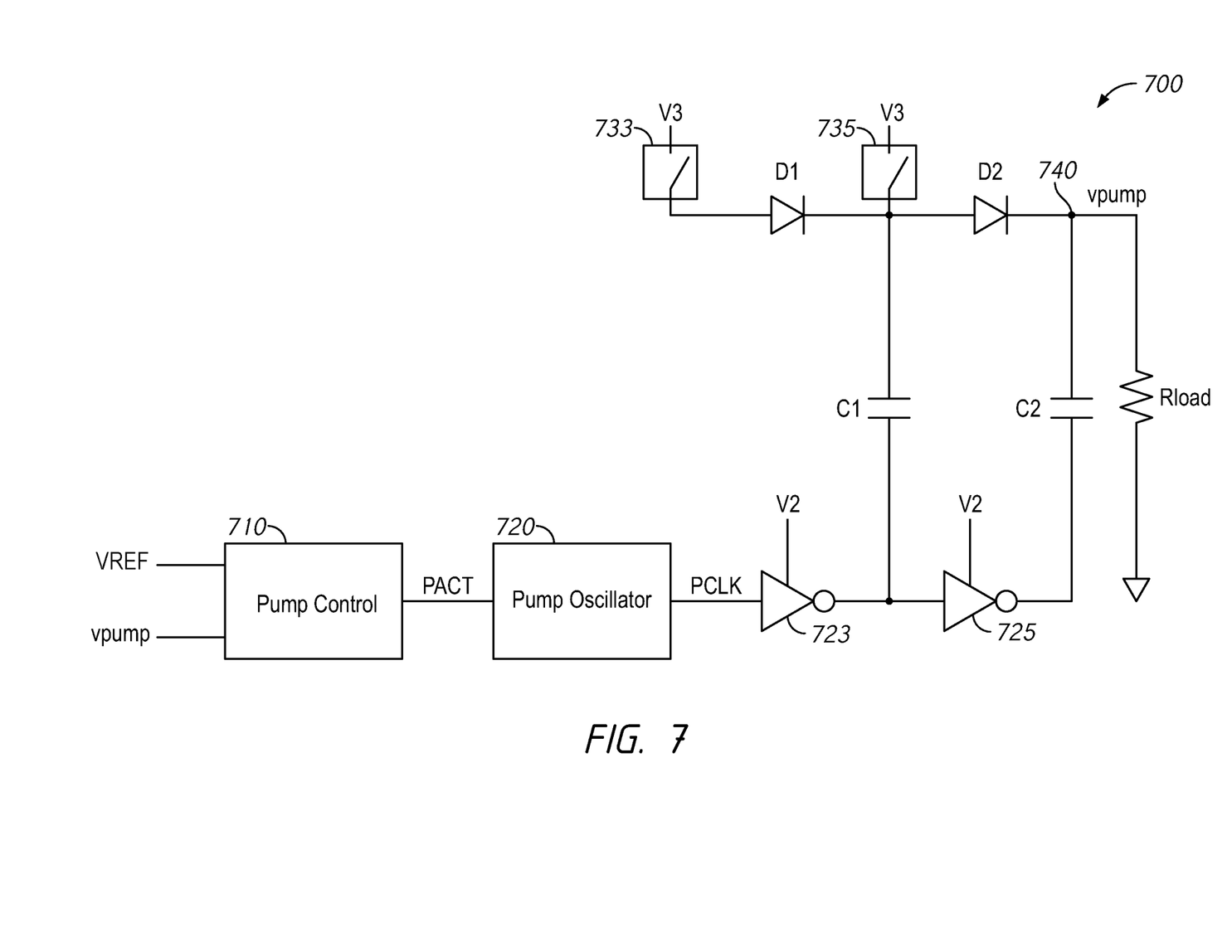
FIG. 7 is a schematic diagram of a voltage pump circuit according to an embodiment of the disclosure.

FIG. 7 is a schematic diagram of a voltage pump circuit 700 according to an embodiment of the disclosure. In some embodiments, the voltage pump circuit 700 is included in the voltage pump circuit 360 of FIG. 3.

The voltage pump circuit 700 includes pump control circuit 710 that receives a reference voltage VREF and an output voltage of the voltage pump circuit vpump provided at output node 740. The pump control circuit 710 provides an pump activation signal PACT to a pump oscillator 720. For example, the pump control circuit 710 provides an active pump activation signal PACT when output voltage vpump is less than the reference voltage VREF (e.g., operational voltage level of internal power voltage VP2). When the output voltage vpump exceeds the reference voltage VREF, the pump control circuit 710 provides and inactive pump activation signal PACT.

The pump oscillator 720 provides an active periodic clock PCLK that clocks between a high clock level and low clock level when activated by an active pump activation signal PACT. The active clock PCLK drives series-coupled pump stages that include the inverter circuit 723, diode circuit D1, switch circuit 733, and capacitor circuit C1, and include the inverter 725, diode circuit D2, switch circuit 735, and capacitor circuit C2. The switch circuits 733 and 735 are provided the power voltage V3 and the inverter circuits 723 and 725 are provided the power voltage V2. The switch circuits 733 and 735 are clocked in coordination with the active periodic clock PCLK to "pump" the power voltages V2 and V3 through the pump stages to provide an output voltage vpump at the output node 740 having a voltage level higher than the V2 and V3 operational voltage levels. When the voltage level of the output voltage vpump exceeds the reference voltage VREF, the voltage pumping action is disabled by the pump control circuit 710 (e.g., provides an inactive pump activation signal PACT). When the voltage level of the output voltage vpump drops below the reference voltage VREF, the voltage pumping action is restarted by the pump control circuit 710 (e.g., provides an active pump activation signal PACT).

Figure 8:
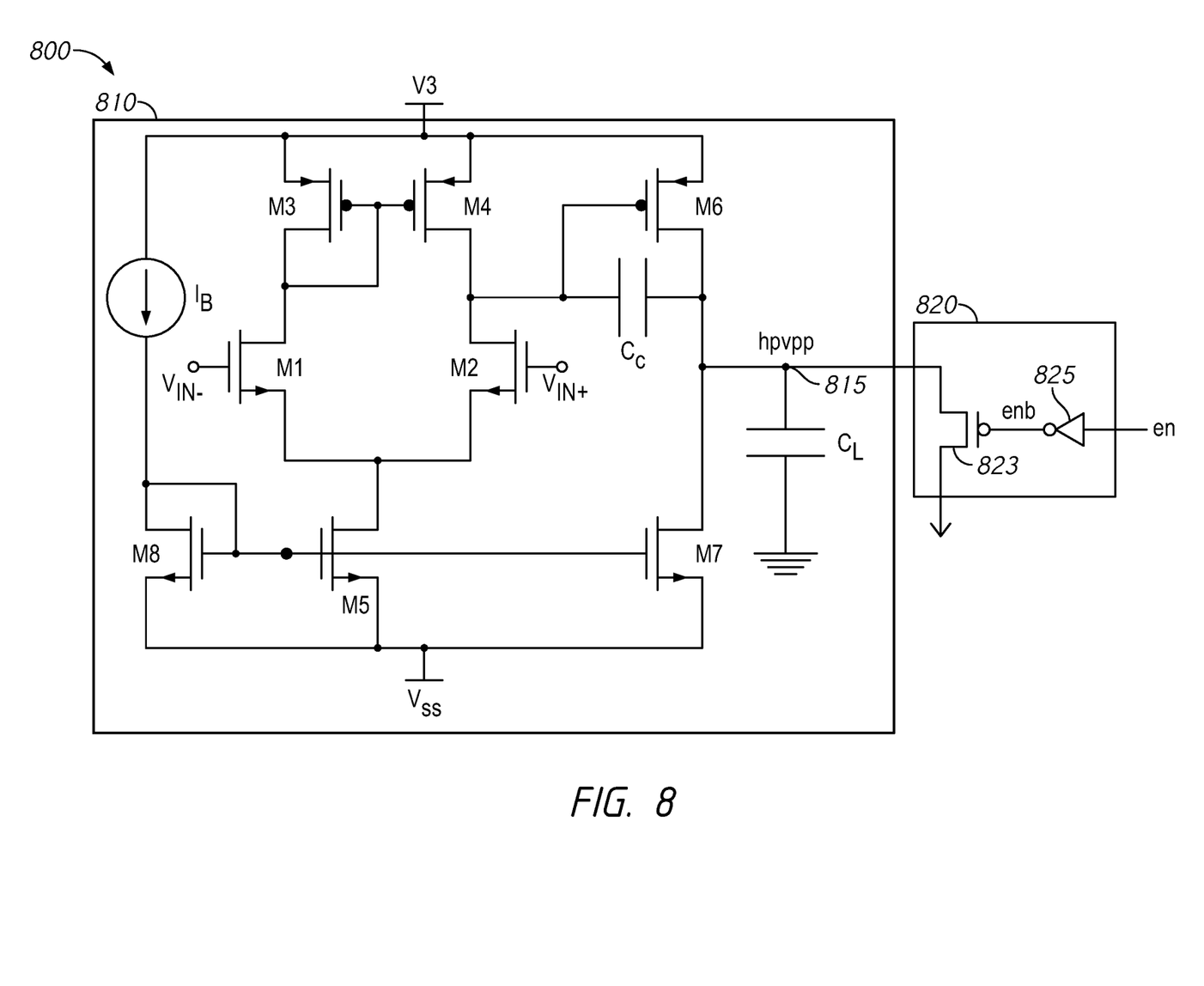
FIG. 8 is a schematic diagram of a voltage regulator circuit according to an embodiment of the disclosure.

FIG. 8 is a schematic diagram of a voltage regulator circuit 800 according to an embodiment of the disclosure. In some embodiments, the voltage regulator circuit 800 is included in the voltage circuit 320 of FIG. 3.

The voltage circuit includes a voltage regulator 810 and an enable circuit 820. The voltage regulator 810 is provided the power voltage V3 and includes a current source having a current circuit that provides a bias current Ib and a current mirror with transistors M5 and M8. The current of the current source is provided to a differential stage that includes transistors M3 and M4 and differential input transistors M1 and M2. An output stage including transistors M6 and M7, and capacitor Cc provide a regulated output voltage hpvpp at an output node 815. A output load is also shown in FIG. 8 as capacitor C1. The regulated output voltage hpvpp is provided to the enable circuit 820. The regulated output voltage hpvpp is provided through a transistor 823 when activated by an output of inverter 825 that receives the enable signal en.

The regulated output voltage hpvpp may be provided, for example, to an internal power node. As previously described with reference to FIG. 3, a voltage circuit 320 may provide an output voltage to the internal power node 315 as the internal power voltage VP1 when activated following completion of a reset operation.

Figure 9:
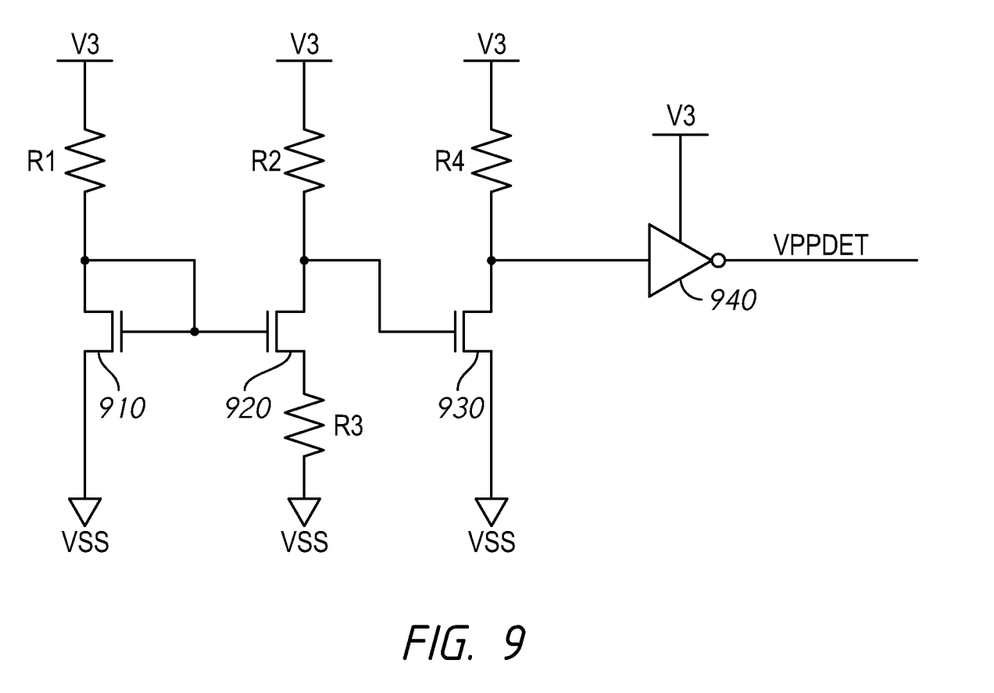
FIG. 9 is a schematic diagram of a voltage detector circuit according to an embodiment of the disclosure.

FIG. 9 is a schematic diagram of a voltage detector circuit 900 according to an embodiment of the disclosure. In some embodiments, the voltage detector circuit 900 is included in the voltage detector circuit 352 of FIG. 3.

The voltage detector circuit 900 includes a current source and a detection circuit. The current source includes the resistors R1-R3 and transistors 910 and 920. The resistors R1 and R2 are provided the power voltage V3, and the transistors 910 and 920 are coupled to provide a current through the resistors R2 and R3 to provide an output voltage that is based on the ratio of the resistors R2 and R3. The output voltage is provided to activate transistor 930 such that when the power voltage V3 increases to a voltage level that causes a voltage drop across the resistor R4 sufficient to trigger the inverter 940, an active control signal VPPDET (e.g., active high logic level) is provided to indicate that the power voltage V3 has reached a trigger voltage. As previously described, the active control signal VPPDET may be provided to clamp control logic 354, which in turn provides an active control signal CLMPACT to activate clamp circuit 340 when the power voltage V3 reaches the trigger voltage. The control signal CLMPACT may be provided by the inverter 940 having a high logic level with a voltage level of the power voltage V3.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. For example, embodiments of the disclosure may be included in various semiconductor devices that receive multiple power voltages for operation, and are not limited to use with semiconductor memory. Accordingly, the scope of the disclosure should not be limited any of the specific embodiments described herein.

What is claimed is:

1. An apparatus, comprising:
   a first power node configured to receive a first power voltage;
   a second power node configured to receive a second power voltage;
   a first internal power node;
   a second internal power node;
   a first clamp circuit coupled to the first power node and the first internal power node, the first clamp circuit configured to hold the first internal power node at a first voltage level based on the first power voltage;
   a second clamp circuit coupled to the first power node and the second internal power node, the second clamp circuit configured to hold the second internal power node at a second voltage level based on the first power voltage, the second voltage level greater than the first voltage level;
   a third clamp circuit coupled to the second power node and the second internal power node, the third clamp circuit configured to hold the second internal power node at a third voltage level based on the second power voltage when the second power voltage reaches a trigger voltage level, the third voltage level greater than the first and second voltage levels.

2. The apparatus of claim 1, further comprising a voltage circuit coupled to the second power node and the first internal power node, the voltage circuit configured to drive the first internal power node to a first internal voltage level greater than the first voltage level.

3. The apparatus of claim 2 wherein the voltage circuit comprises:
a voltage regulator circuit coupled to the second power node and configured to provide a voltage at an regulator output based on the second power voltage; and
an enable circuit coupled to the first internal power node and the voltage regulator circuit, the enable circuit configured to provide the voltage at the regulator output to the first internal power node when activated.

4. The apparatus of claim 1, further comprising a voltage pump circuit coupled to the first and second power nodes, and further coupled to the second internal power node, the voltage pump circuit configured to drive the second internal power node to a second internal voltage level that is greater than the second voltage level.

5. The apparatus of claim 1 wherein the first clamp circuit is configured to provide a first voltage drop relative to the first power voltage to set the first voltage level and wherein the second clamp circuit is configured to provide a second voltage drop relative to the first power voltage to set the second voltage level, the second voltage drop less than the first voltage drop.

6. The apparatus of claim 1 wherein the first clamp circuit comprises a diode-coupled transistor having a first threshold voltage and the second clamp circuit comprises a diode-coupled transistor have a second threshold voltage, wherein the second threshold voltage is less than the first threshold voltage.

7. The apparatus of claim 1 wherein the third clamp circuit is configured to provide the second power voltage to the second internal power node when activated.

8. The apparatus of claim 7 wherein the third clamp circuit comprises:
a first transistor coupled to the second power node and the second internal power node, the first transistor configured to provide a voltage from the second power node to the second internal power node when activated;
a first diode-coupled transistor coupled to the second internal power node and a body of the first transistor;
a second diode-coupled transistor coupled to the second power node and the body of the first transistor;
a second transistor coupled to the body of the first transistor and the second power node, the second transistor configured to provide the second power voltage to the body of the first transistor when activated; and
a third transistor coupled to the body of the first transistor and the second internal power node, the third transistor configured to provide a voltage of the second internal power node to the body of the first transistor when activated.

9. An apparatus, comprising:
a first clamp circuit configured to receive a first external power voltage and provide a first voltage drop to provide a first internal power voltage;
a second clamp circuit configured to receive the first external power voltage and provide a second voltage drop to provide a second internal power voltage, wherein the first voltage drop is greater than the second voltage drop;
a third clamp circuit configured to receive a second external power voltage and provide the second external power voltage as the second internal power voltage when the second external power voltage is activated; and a clamp control circuit configured to activate the third clamp circuit when the second external power voltage reaches a trigger voltage level.

10. The apparatus of claim 9 wherein the clamp control circuit comprises:
a voltage detector coupled to the second power node and configured to provide an active detection control signal when the second external power voltage reaches the trigger voltage level; and
clamp control logic configured to provide an active control signal to activate the third clamp circuit when the detection control signal from the voltage detector is active.

11. The apparatus of claim 9 wherein the clamp control logic is further configured to provide an inactive control signal to deactivate the third clamp circuit when a voltage of the second internal power voltage is greater than the second external power voltage.

12. The apparatus of claim 9 wherein the trigger voltage is greater than an operational voltage level of the first external power voltage and less than an operational voltage level of the second external power voltage.

13. The apparatus of claim 9, further comprising a voltage pump circuit configured to drive the second internal power voltage to an operational voltage level that is greater than the second external power voltage.

14. The apparatus of claim 9, further comprising a voltage circuit configured to drive the first internal power voltage to an operational voltage level based on a voltage of the second external power voltage, the operational voltage level of the first internal power voltage greater than an operational voltage level of the first external power voltage and less than an operational voltage level of the second external power voltage.

15. The apparatus of claim 9 wherein the first clamp circuit comprises a first diode and the second clamp comprises a second diode, the first diode having a first threshold voltage to provide the first voltage drop and the second diode having a second threshold voltage less than the first threshold voltage to provide the second voltage drop.

16. The apparatus of claim 9 wherein the third clamp circuit comprises:
a transistor configured to provide the second external power voltage as the second internal power voltage when activated by the clamp control circuit;
a plurality of transistors coupled to a body of the transistor and configured to receive the second external power voltage and the second internal power voltage and further configured to dynamically bias the body of the transistor.

17. A method, comprising:
receiving a first external power voltage
receiving a second external power voltage
reducing the first external power voltage by a first amount to provide a first internal power voltage at a first internal power node;
reducing the first external power voltage by a second amount to provide a second internal power voltage at a second internal power node, the first amount greater than the second amount; and
providing the second external power voltage to the second internal power node when the second external power voltage reaches a trigger voltage level.

18. The method of claim 17 wherein the first external power voltage is received before the second external power voltage, and an operational voltage level of the first external power voltage is less than an operational voltage level of the second external power voltage.

19. The method of claim 18 wherein the trigger voltage level is greater than the first external power voltage and less than the second external power voltage.

20. The method of claim 17 wherein reducing the first external power voltage by the first amount comprises reducing the first external power voltage with a first diode and wherein reducing the second external power voltage by the second amount comprises reducing the second external power voltage with a second diode, wherein a first threshold voltage of the first diode is greater than a second threshold voltage of the second diode.

21. The method of claim 17, further comprising receive a third external power voltage, wherein the third external power voltage is received before the first external power voltage, and an operational voltage level of the third external power voltage is less than an operational voltage level of the first external power voltage.

22. The method of claim 17 wherein reducing the first external power voltage by the first amount comprises reducing the first external power voltage with a first clamp circuit and wherein reducing the second external power voltage by the second amount comprises reducing the second external power voltage with a second clamp circuit.

23. The method of claim 22 wherein providing the second external power voltage to the second internal power node when the second external power voltage reaches a trigger voltage level comprises activating a third clamp circuit coupled to the second internal power node.

24. A method, comprising:
providing a first internal power voltage from a first diode that receives a first external power voltage, the first diode having a first threshold voltage;
providing a second internal power voltage from a second diode that receives the first external power voltage, the second diode having a second threshold voltage less than the first threshold voltage;
clamping the second internal power voltage to a second external power voltage to increase a voltage level of the second internal power voltage, the second external power voltage having an operational voltage level greater than the first external power voltage.

25. The method of claim 24, further comprising pumping the voltage level of the second internal power voltage to be greater than the second external power voltage.

26. The method of claim 24, further comprising providing a regulated voltage based on the second external power supply as the first internal power supply.

27. The method of claim 24 wherein the second internal power voltage is clamped to the second external power voltage after the second external power voltage exceeds the first external power voltage and has not yet reached the operation voltage level of the second external power voltage.

28. The method of claim 24 wherein providing the first internal power voltage from the first diode comprises clamping the first internal power voltage to the first external power voltage through the first diode and wherein providing the second internal power voltage from the second diode comprises clamping the second internal power voltage to the first external power voltage through the second diode.

* * * * *